United States Patent [19]

Bruce et al.

[11] Patent Number: 5,099,239
[45] Date of Patent: Mar. 24, 1992

[54] MULTI-CHANNEL ANALOGUE TO DIGITAL CONVERTOR

[75] Inventors: Richard H. Bruce, Los Altos; Alan G. Lewis, Sunnyvale; Daniel Senderowicz, Berkeley, all of Calif.

[73] Assignee: Xerox Corporation, Rochester, N.Y.

[21] Appl. No.: 410,566

[22] Filed: Sep. 21, 1989

[51] Int. Cl.$^5$ ............................................. H03M 1/12
[52] U.S. Cl. ..................................... 341/155; 341/128
[58] Field of Search ............... 341/155, 128, 166, 167, 341/161; 357/24

[56] References Cited

U.S. PATENT DOCUMENTS

| | | | |
|---|---|---|---|
| 3,390,347 | 6/1968 | Campbell et al. | 330/51 |
| 3,582,940 | 6/1971 | Kihlberg | 340/397 |
| 3,930,255 | 12/1975 | Means | 357/24 |
| 4,200,863 | 4/1980 | Hodges et al. | 340/347 |
| 4,227,185 | 10/1980 | Kronlage | 341/167 |
| 4,333,022 | 6/1982 | Whelan et al. | 357/24 |
| 4,345,241 | 8/1982 | Takeuchi et al. | 340/347 |
| 4,400,690 | 8/1983 | Brokaw et al. | 341/134 |
| 4,517,549 | 5/1985 | Tsukakoshi | 340/347 |
| 4,742,330 | 5/1988 | Doernberg et al. | 340/347 |
| 4,764,753 | 8/1988 | Yukawa | 341/166 |
| 4,769,628 | 9/1988 | Hellerman | 341/162 |
| 4,849,757 | 7/1989 | Krenik | 341/155 |
| 4,851,838 | 7/1989 | Shier | 341/128 |
| 4,851,839 | 7/1989 | Reinke | 341/166 |
| 4,851,845 | 7/1989 | Hotta et al. | 341/159 |
| 4,857,929 | 8/1989 | Katzenstein | 341/148 |
| 4,876,544 | 10/1989 | Kuraishi | 341/166 |

FOREIGN PATENT DOCUMENTS

| | | |
|---|---|---|
| 0308982 | 3/1989 | European Pat. Off. . |
| 3405438 | 8/1985 | Fed. Rep. of Germany . |
| 3423206 | 8/1985 | Fed. Rep. of Germany . |

*Primary Examiner*—Benjamin R. Fuller
*Assistant Examiner*—Randy W. Gibson
*Attorney, Agent, or Firm*—Townsend and Townsend

[57] ABSTRACT

A multichannel ADC is fabricated on a single IC with each analog channel for concurrently processing input analogue signal in a pipelined manner and including a dual purpose intermediate amplifier for amplifying an input voltage to be converted and providing a reference voltage for use during conversion. A unique capacitor array reduces the area required to implement the convertors.

14 Claims, 9 Drawing Sheets

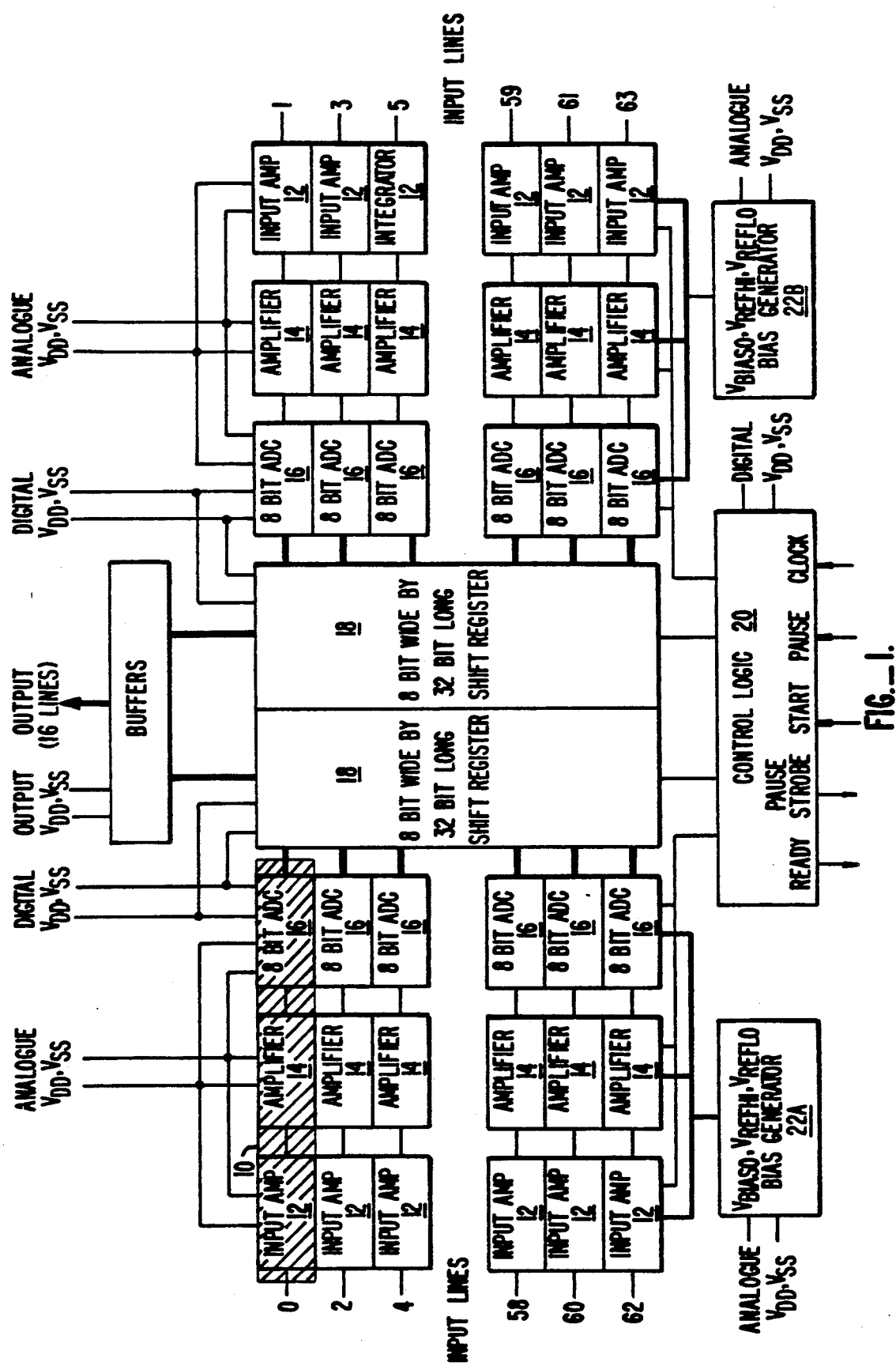
FIG._1.

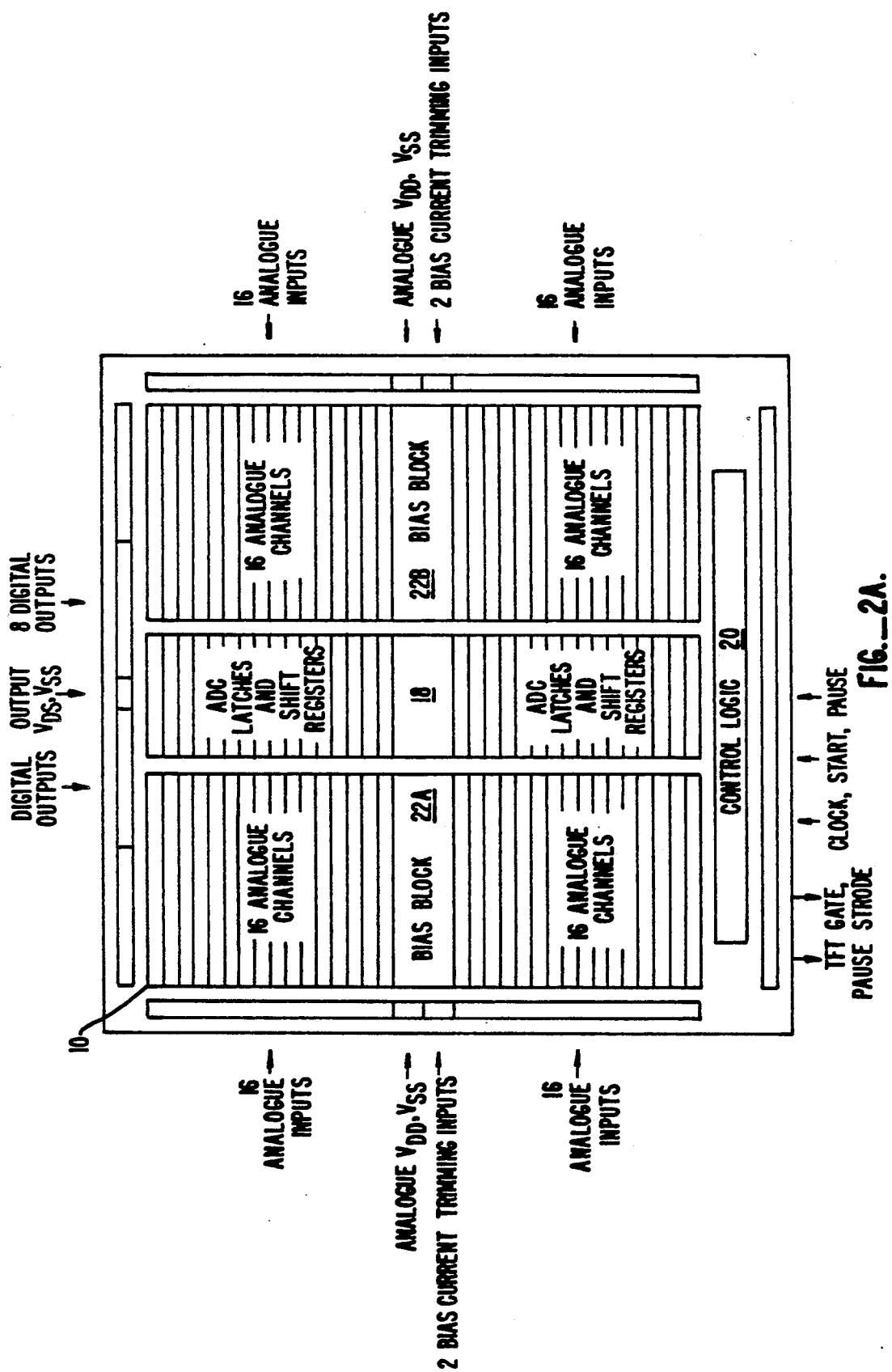
FIG._2A.

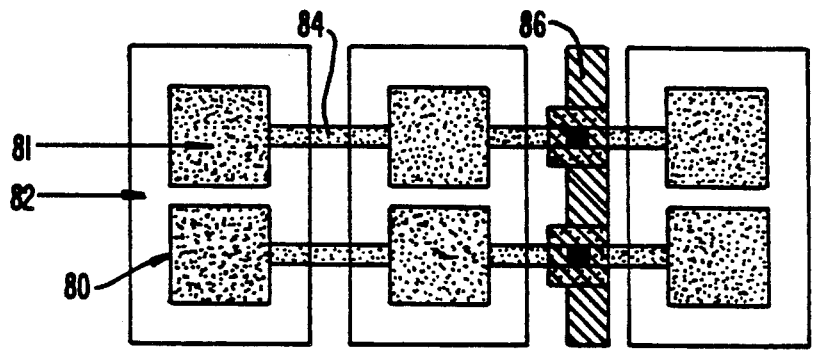
FIG._2B.
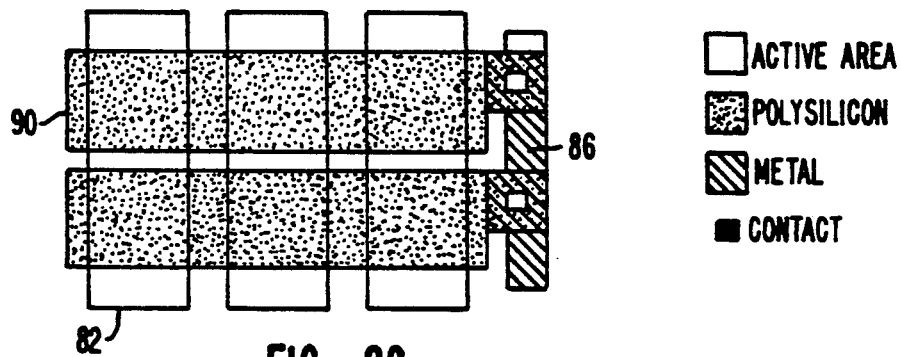
FIG._2C.
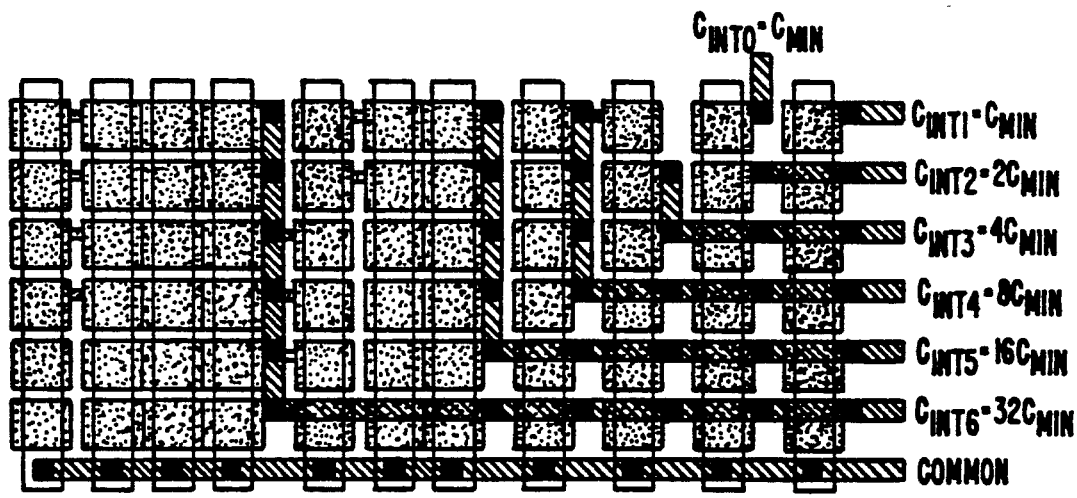
FIG._2D.

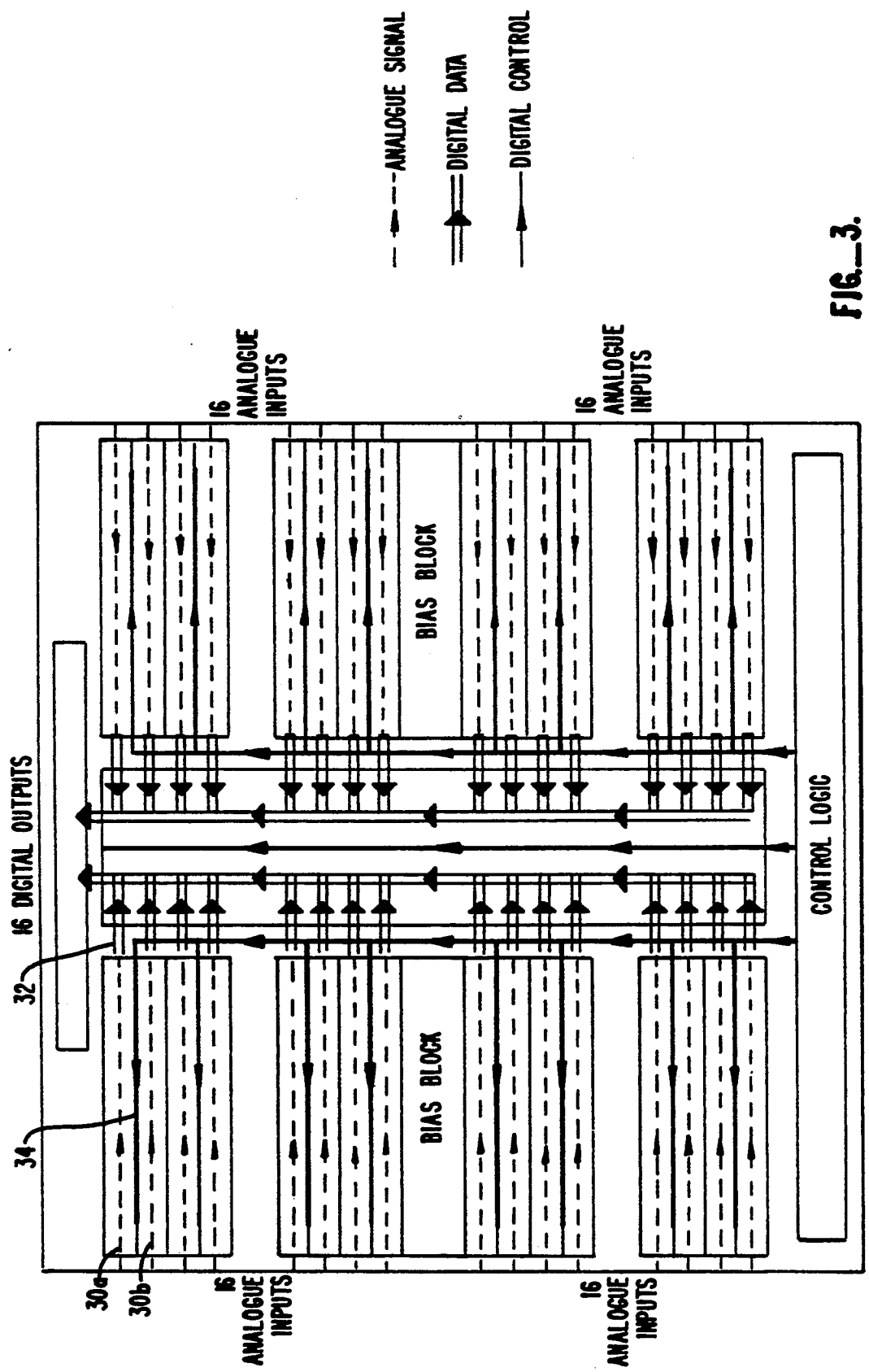
FIG._3.

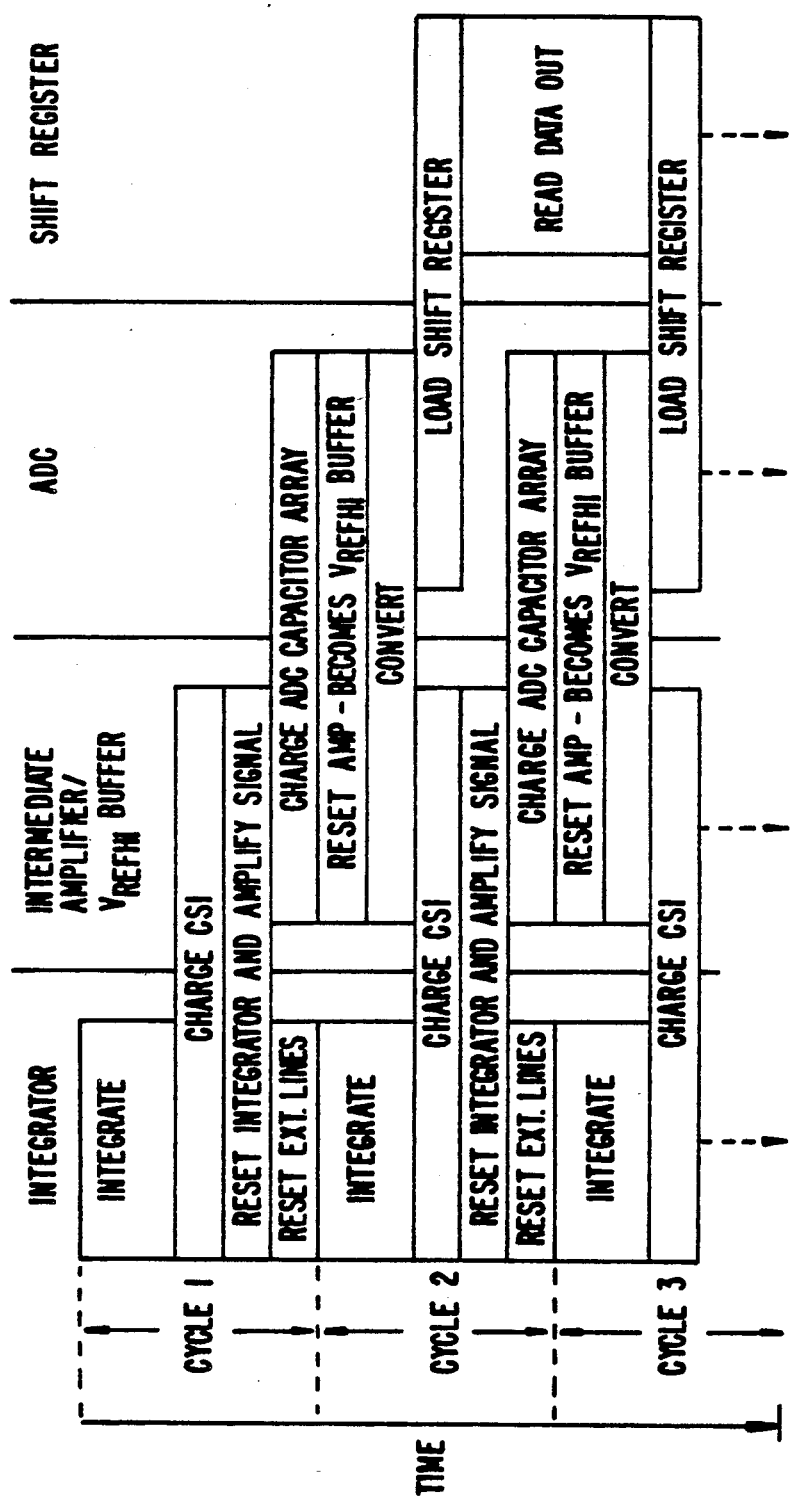

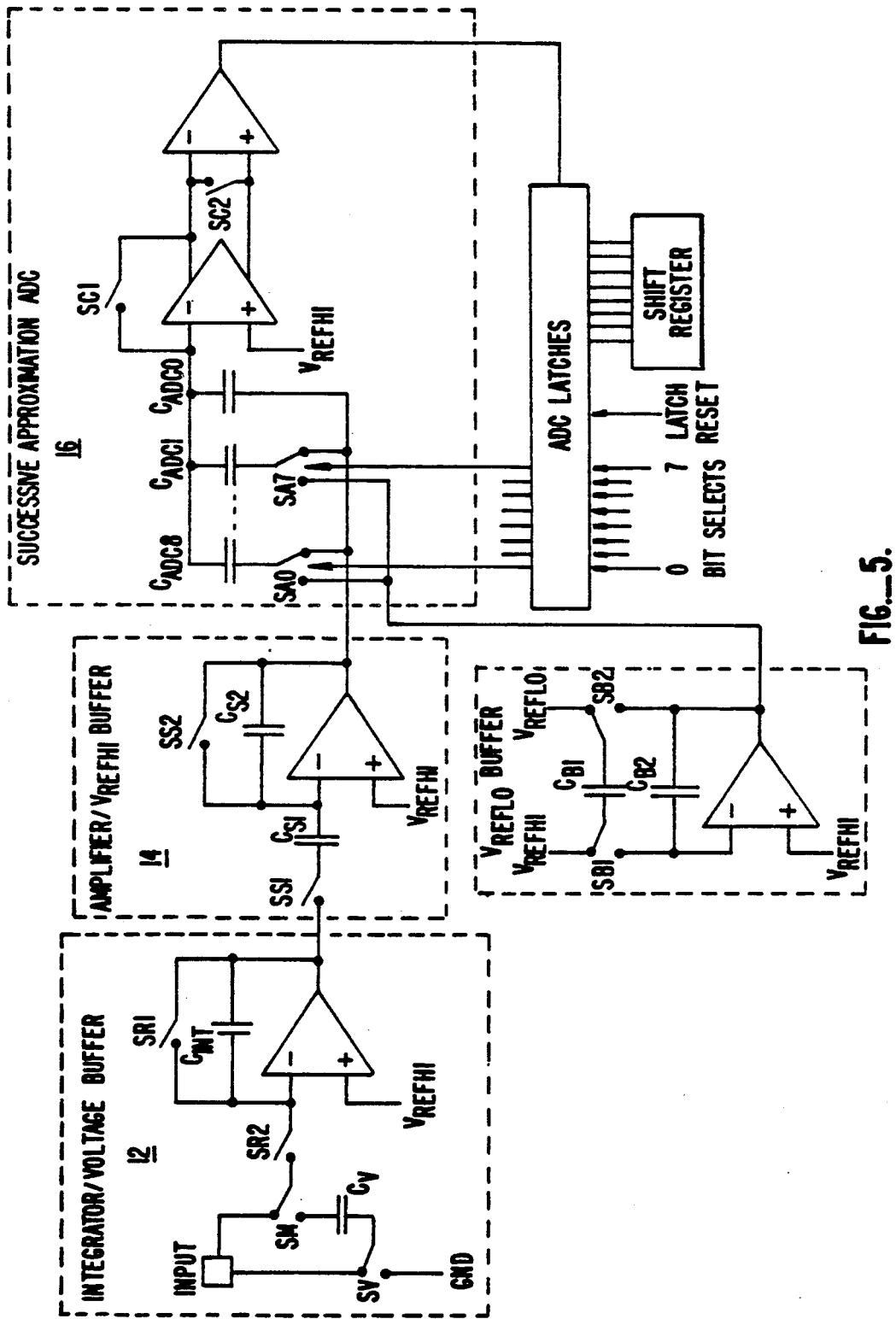
FIG._5.

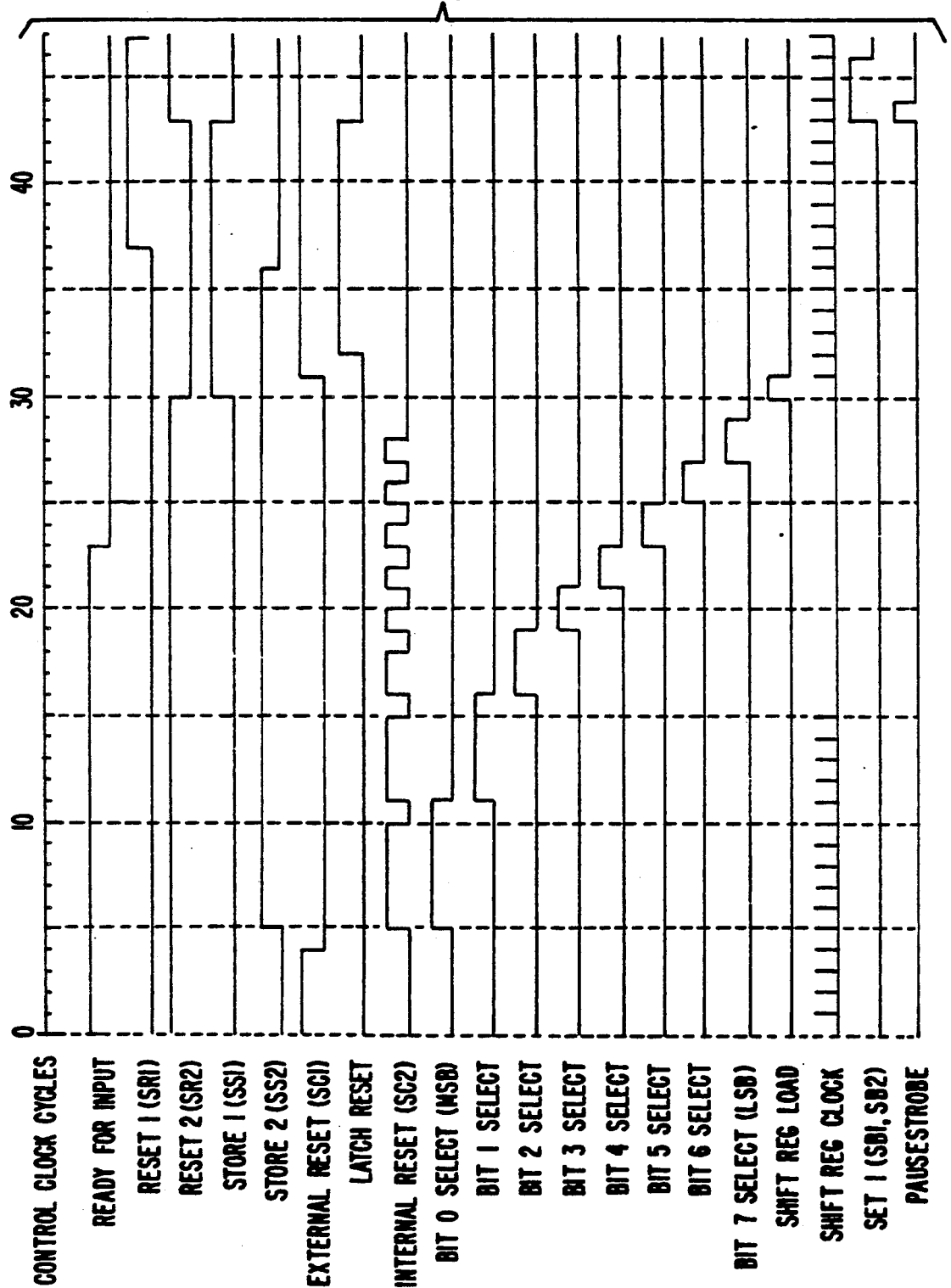

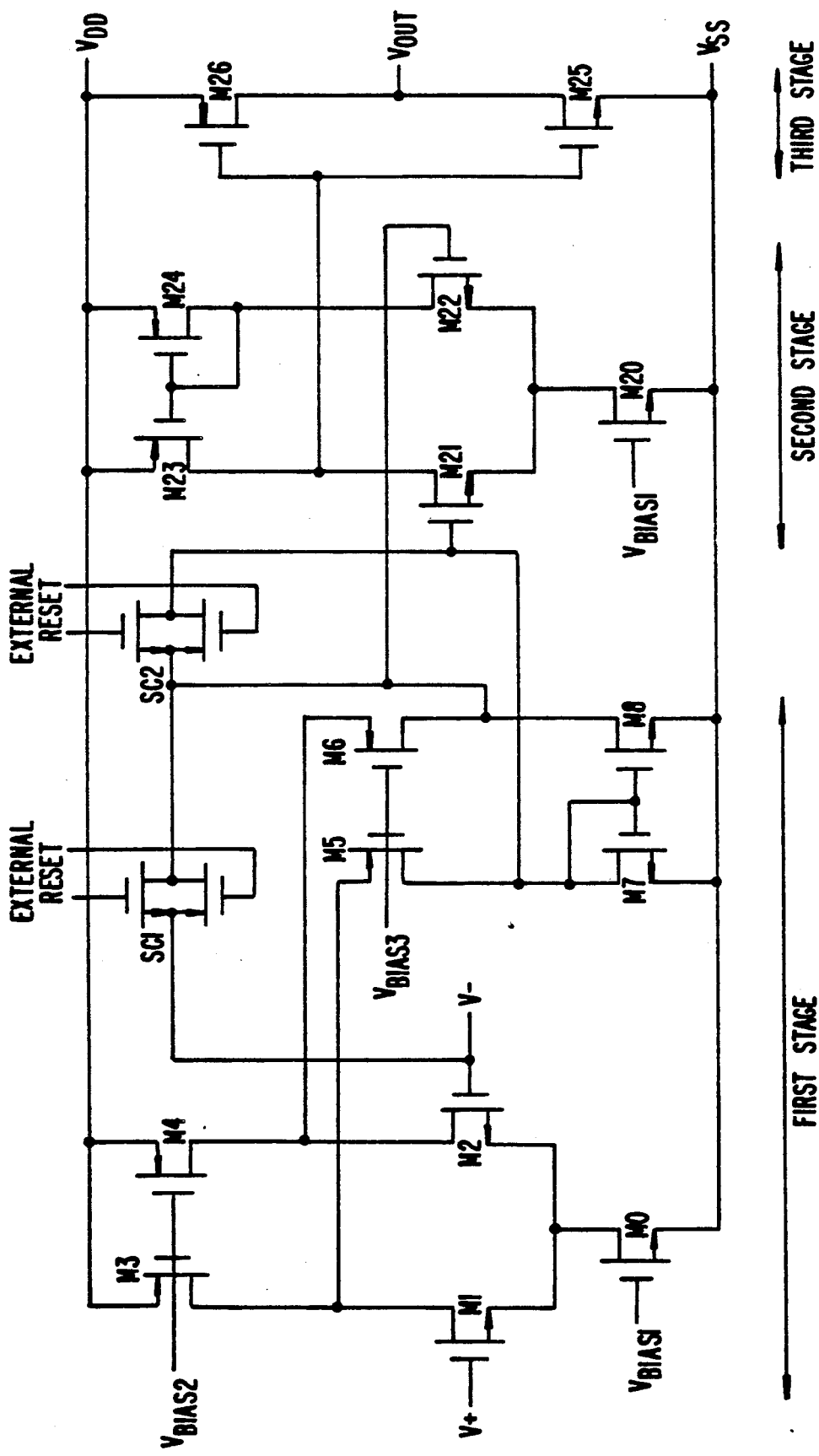
FIG._7.

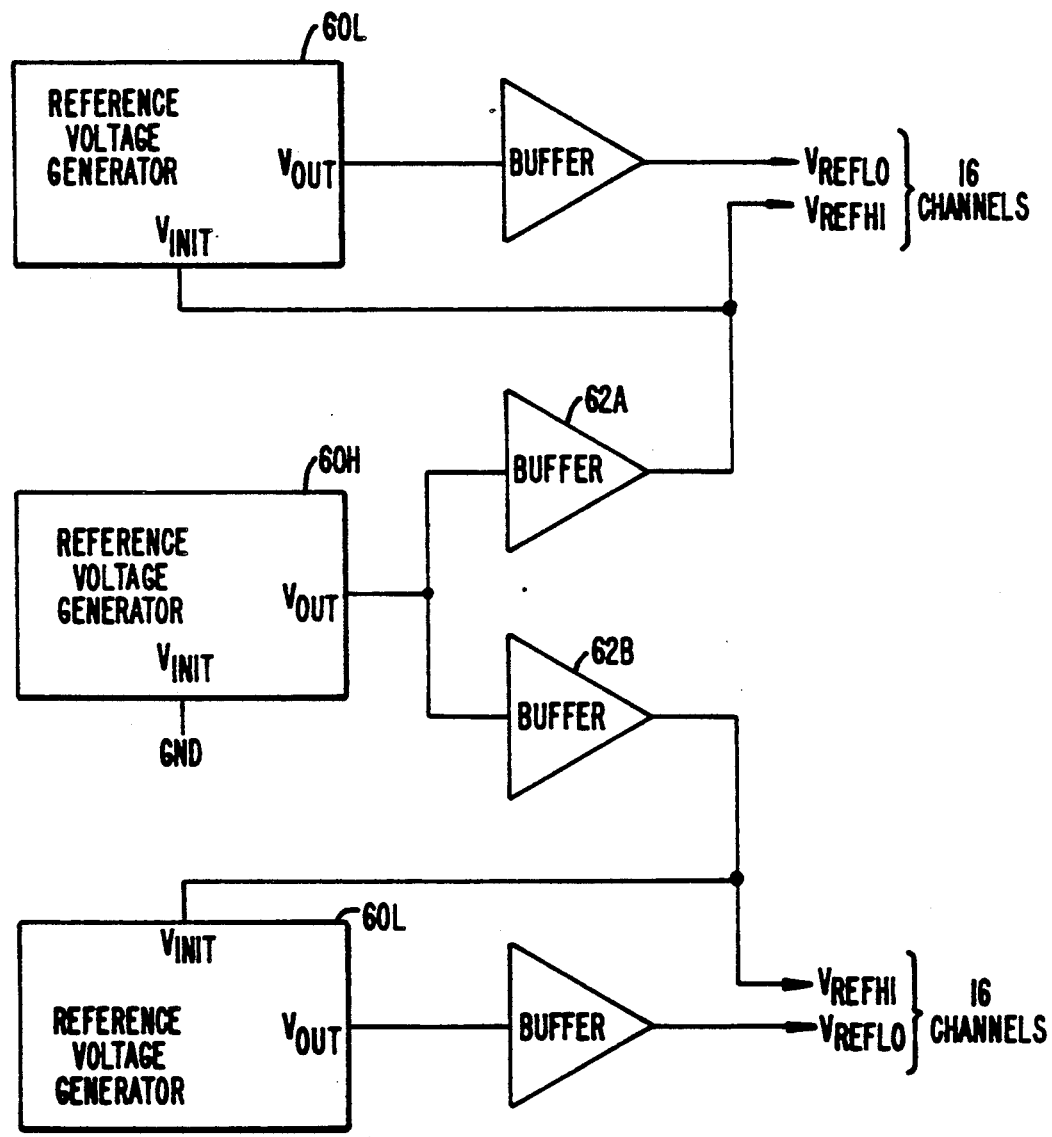
FIG._8.

MULTI-CHANNEL ANALOGUE TO DIGITAL CONVERTOR

BACKGROUND OF THE INVENTION

Many measurement or sensing systems require the processing of analogue signals from a large array of detectors. The processing is generally carried out using a digital sub-system, so analogue-to-digital conversion must be performed on the detector outputs.

The analogue-to-digital converter (ADC) must be able to accommodate many simultaneous inputs, and have large throughput. A conventional approach would be to utilize a small number of fast ADCs, each preceded by an analog multiplexer which selects one of the many analog inputs at a time for conversion. However, this technique has limitations; in particular, the analog multiplexing may introduce noise and errors into the analog signals, and the single ADC may be large (an N-bit flash ADC requires $2^N$ comparators and the multiplexing hardware will further increase the chip size) and dissipate significant power in order to meet the speed requirements.

SUMMARY OF THE INVENTION

The present invention is a novel ADC system for achieving a high throughput analog-to-digital converter for interfacing analog sensor arrays to a digital system. The system is based on the use of an array of small, low power ADCs and a shift register to transfer the digital data to the output.

Several levels of pipelining are employed in order to increase the effective throughput. The ADC is implemented on a single chip, and has a throughput similar to the throughput of a fast single ADC. However, the invention eliminates the need for analog multiplexing, and the circuit is sufficiently small that input circuits suitable for connecting directly to the sensor array can be included with the ADCs. Thus, the complete interface between an array of analog sensors and a digital signal processor is realized on a single chip.

According to one aspect of the invention, the digital and analog signal paths are separated to reduce noise injection into the analog signals.

According to a further aspect of the invention, a single amplifier is used to charge the ADC capacitors to the analog signal voltage level and to buffer a reference voltage utilized during conversion.

According to a further aspect of the invention, an input integrator is isolated from a charge source during reset and signal transfer to a signal amplifier to prevent the high parasitic capacitance of the array from slowing down the reset and signal transfer operations.

According to a further aspect of the invention, a dual mode input stage is provided to facilitate the conversion of analog charge or voltage signals.

According to a still further aspect of the invention, a unique capacitor array is provided that reduces the chip area required to form the array.

Other features and advantages will be apparent in view of the appended drawings and following detailed description.

BRIEF DESCRIPTION OF THE DRAWING

FIG. 1 is a block diagram of the system architecture;
FIG. 2A is a schematic diagram of the chip floorplan;
FIG. 2B is a schematic diagram of a typical capacitor array;
FIG. 2C is a schematic diagram of the capacitor array of the present invention; and
FIG. 2D is a schematic diagram of a complete ADC capacitor array;
FIG. 3 is a schematic diagram depicting the analog and digital signal paths;
FIG. 4 is a schematic diagram illustrating pipelining;
FIG. 5 is a schematic diagram of an analog channel;
FIG. 6 is a timing diagram depicting the states of the control signals that control the operation of the analog channel; and
FIG. 7 is a schematic diagram of a comparator; and
FIG. 8 is a schematic diagram of the reference voltage generation and distribution system.

DETAILED DESCRIPTION OF THE PREFERRED EMBODIMENTS

The features that allow integration of a large number of ADCs on a single chip fall into three main areas. First, the design of the analog input circuit and ADC; second, the generation and distribution of bias and reference voltages, and third, the physical layout of the system as a whole. These three aspects of the design are described in detail below. The techniques described are suitable for implementing a large number of ADCs on a single chip, which in this context could be from a few tens to several hundreds. In preferred embodiment, the techniques are demonstrated with 64 integrated ADCs.

To achieve maximum throughput, the design is pipelined. Thus, while an input charge is being integrated (or a voltage sampled), analog-to-digital conversion is being carried out on the previous signal, and at the same time the digital data corresponding to the signal before that is made available at the outputs.

Turning first to the architecture of the system as a whole, FIG. 1 shows the architecture of a Multi-channel Analog-to-Digital Converter (MAD) integrated circuit chip that is a preferred embodiment of the present invention.

In FIG. 1, 64 identical analog channels 10 each consists of an input amplifier 12, which can function either as an integrator with low input impedance for sensing charge from the sensor array or as a switched capacitor buffer with high input impedance for sensing voltage, an intermediate amplifier/reference voltage buffer 14 and an 8-bit successive approximation ADC 16. The digital outputs from the ADC 16 are loaded in parallel into a shift register 18, and subsequently read out serially.

A control logic unit 20 receives externally supplied clock and start and pause synchronization signals, provides control signals to the various analog channels 10 and shift register 18, and an external synchronization signal and pause strobe. The start signal indicates that the system is ready to receive data from an external source and the pause signal allows the system to be temporarily halted without loss of data to facilitate synchronization with slow systems.

The shift register output ports are coupled to an output buffer 22 that drives the signals onto an external bus. On-chip bias generators 23a and b provide bias voltages to the analog channels 10.

The overall architecture illustrated in FIG. 1 has several advantages over the alternative of a multiplexer and single fast ADC. Firstly, the analog signal path is simple and short, minimizing the possibility of signal degradation The multiplexing is carried out by the shift register 18 on digital data, so there is no loss of information. Second, the system of the invention is more efficient in the sense that the individual sub-circuits are able to operate through most of the chip cycle. In a single ADC system, not only would the ADC have to perform 64 conversions, but there would be significant idle time between each conversion while the analog multiplexer settled and transferred its signal to the ADC.

The physical layout of the preferred embodiment is depicted in FIG. 2A. The physical layout of the system is important from two points of view. First, it determines the packing density of the chip; the most important feature in this respect is the structure of the ADC capacitor array described below. Second, the layout has a strong potential influence on the performance of the system, particularly the analog sections, and it is necessary to adopt an appropriate structure for the high level of integration in the MAD chip.

It can be seen that the system contains significant amounts of digital circuitry as well as analog. A major problem with such mixed systems is the injection of noise into the analog sections from the digital. In the preferred embodiment, several features minimize this noise injection. First, the analog sections are contained in well defined regions of the chip, isolated from the digital circuitry by n- and p-type guard bands; this helps minimize the influence of charge injection into the substrate from the digital circuits. Second, separate power supply pads are provided for the analog circuits, digital sections and output buffers, minimizing injection through the supply lines of spurious signals arising from digital switching transients. Third, no digital signals enter the analog sections of the chip except to control the analog switches. Fourth, no analog signal enters the digital sections of the chip.

Each ADC 16 in the analog channel includes an ADC capacitor array is the single largest element in the analog input channel. Thus, minimizing the size of the array is critical to the ability to integrate 64 ADCs on the same chip. The structure of the array utilized in the preferred embodiment is described in detail with reference to FIGS. 2B through 2D.

The capacitors are binary weighted, such that C(ADC2)=2C(ADC1) and so on; thus C(ADC8)=12-8(ADC1). In order to ensure close matching, all the capacitors are made up of parallel combinations of a minimum capacitor. Thus, 256 such capacitors are required.

Conventionally, polysilicon to diffusion capacitors 80 are laid out as shown in FIG. 2B. An island of polysilicon 81 is entirely surrounded by active area 82, and a small strip 84 is used to connect a polysilicon island 81 to a metal contact 86 on thick oxide. All the capacitors 80 in an ADC array must be laid out in the same way.

In the present chip, an alternative layout is used to reduce the area as depicted in FIG. 2C. In this layout, the capacitance is set by the area of overlap of a polysilicon strip 90 with an active area diffusion 80. By ensuring that the polysilicon strip 90 crosses the diffusion completely, the capacitance is insensitive to alignment errors between the edges of the poly island 81 and the edge of the active area 82 that occur in the layout depicted in FIG. 2B. This allows tighter packing of the capacitors 80, as illustrated in FIG. 2C.

FIG. 2D shows a complete ADC capacitor array using the layout described with reference to FIG. 2C. For simplicity, a 6-bit array is shown, although the area saving with this technique increases with the number of capacitors. Note that very little area is used for wiring between the capacitors 80 since they can often simply be butted together. The wiring is also almost entirely contained within the array without area penalty, and no metal line passes over a capacitor plate to which it is not connected. This technique thus allows a very compact ADC capacitor array to be realized; a similar array laid out conventionally is approximately 60% larger, corresponding to an increase of about 10% in chip area.

FIG. 3 shows a simplified floor plan of the MAD chip illustrating this separation of analog signal path 30, digital data signal path 32, and digital control signal paths 34. The digital signal paths 32 include the connection from the ADC 16 to the shift register 20 and the shift register itself. Note that none of these digital signal paths 32 cross the analog signal paths 30 The input circuits and ADCs are laid out in mirrored pairs (so that each channel 10 is the mirror image of the ones above and bellow it). Thus, a pair of analog signal paths 30a and 30b are controlled by a single digital signal path 30. The digital control lines for controlling the switches in each of the pair 30a and 30b branch from the digital control path 30 thus minimizing the intrusion of digital signals into the analog channel. Further, this feature allows the pair 30a and 30b to share control lines, again saving area.

Turning next to the design of the analog channel 10 and the ADC, each analog channel is pipelined to achieve high throughput.

FIG. 4 is a schematic diagram illustrating the pipeline stages of a single analog channel 10.

An input analog charge signal is received at the beginning of each charge cycle. As is depicted in cycle 1, firstly, a first analog input signal is integrated to form an input voltage signal, secondly, the input capacitor CS1 is charged to the input voltage signal level, thirdly the integrator is reset and the input voltage signal is amplified by the intermediate amplifier to a first amplified voltage level, and finally, the ADC capacitors are charged by the intermediate amplifier to the first amplified voltage level while the external lines are reset. These processing steps are the same for each received analog input signal.

Pipelining is illustrated in cycles 2 and 3. A second analog signal is integrated at the beginning of cycle 2 while the first input voltage signal is converted to a digital representation by the ADC. During this conversion the intermediate amplifier supplies VREFHI to the ADC. The digital representation of the first analog signal is loaded to the digital shift register while CS1 is charged to the second input voltage level. The readout of the digital representation of the first analog input signal via the digital shift register is started at the end of cycle 2 while the second input voltage level is amplified and stored in the ADC.

After two cycles the pipeline is full and three signals are processed each cycle. At the beginning of cycle 3 a third analog charge signal is integrated while the second analog signal is converted and the digital representation of the first analog signal is shifted to the output buffer. A novel feature of this pipeline is the use of the amp 14 both to amplify the input signal to charge the ADC capacitors to the input voltage and as a buffer to provide a reference voltage during the conversion operation.

The input circuit and ADC are replicated 64 times on the system chip. It is thus critical to the ability to achieve this level of integration that each channel be physically small enough, while at the same time maintaining adequate speed for the required throughput and a reasonable power dissipation. The issue of speed is partially dealt with by the pipelined architecture, but a number of other novel features are also necessary as described below.

A simplified schematic of the input circuit and ADC is shown in FIG. 5 and a timing diagram showing the timing of all control signals is depicted in FIG. 6. The switches are in the positions shown in FIG. 5 when the control signals depicted in FIG. 6 are low. All the switches shown are MOS transistors driven by control signals from the Control Logic block 20 shown in FIG. 1.

The first stage of the analog channel 20 is the input integrator 12 which can also be used as a voltage buffer; the mode is simply selected by switch SM. In the voltage sensing mode, switch SV switches one plate of the capacitor Cv between the input and ground; the other plate is connected to the integrator 12 so that the complete input circuit operates as a sample-and-hold device. For charge sensing, switch SM connects the integrator 12 directly to the input pad. The timing of the rest of the circuit is the same in both voltage sensing and charge sensing modes. The charge sensing mode is the most critical for the system, and is described in the rest of this section.

Charge integration is performed in the conventional manner, resulting in a signal voltage at the output of the integrator 12. Once integration is complete, the signal must be transferred to the intermediate amplifier 14 and the integrator 12 reset. However, the integrator input is connected directly to the external sensor and in general there will be a large parasitic capacitance associated with this link. This appears in parallel with the input capacitance of the operational amplifier used in 10 the integrator, and severely slows both the signal transfer to the intermediate amplifier 14 and the reset. The solution to this problem has been to isolate the integrator input from the external sensor for these operations.

Once the charge has been integrated during control clock cycles 0–30 Reset 2 goes low at control clock cycle 30 and SR2 is opened, isolating the integrator 12 from the input. At this stage Store 2 is high and switch SS2 is already closed to provide VREFHI to the right-hand plate of capacitor CS1, and at control clock cycle 30 Store 1 goes high so that SS1 is also closed to the input signal voltage level, i.e., the integrator output voltage, to the left-hand plate of capacitor CS1. Only the intrinsic integrator operational amplifier input capacitance is present to slow this signal transfer.

Once CS1 is charged to the integrator output voltage. Store 2 goes low at control clock cycle 36 to open SS2 and Reset 1 goes high at control clock cycle 37 to close SR1, shorting the integration capacitor and resetting the integrator 12 so that the output voltage of the integrator 12 becomes VREFHI. The charge from CS1 is transferred to CS2, and the magnitude of the output signal of amp 14 is the integrator output voltage multiplied by a gain factor equal to the ratio of CS1/CS2.

Thus, in the analog input circuit it is the output voltage change at the output of the integrator 12 during reset which is amplified rather than the voltage change during integration, although these two are equal and opposite. Once the integrator 12 is reset, Store 1 goes low at control clock cycle 43 to open SS1, separating the amplifier from the integrator; both are then free to perform other operations, achieving the first level of pipelining. In the case of the integrator, SR2 is first closed to reset the input line and SR1 is the opened to integrate the next analog input charge signal. The amplifier charges the ADC capacitor array as discussed below.

The sequence described above has three advantages in addition to preventing high input capacitance from slowing down signal transfer and reset. First, the integrator reset and signal amplification operations are merged, improving throughput and facilitating the pipelined operation. Second, the load seen by the integrator during integration is very small. Third, the amplification takes up a small part of the chip cycle, making the amplifier 14 available to act as a reference voltage buffer for the rest of the chip cycle as described below.

An important aspect of the input circuit and ADC design which allows minimization of area and power dissipation, as well as improved accuracy, is the dual function performed by the intermediate amplifier 14. The amplification operation is described above; the manner in which it is implemented makes it fast, and also limits it to a time when the ADC is dormant, that is during the signal transfer between integrator and amplifier required for pipelining. Thus, the amplifier is available to act as a reference voltage buffer for the Adc during the time when the ADC is active.

During amplification of the signal, when Store 2 is low, the ADC capacitor array is held at VREFLO, that is switches SA0–SA7 are in the left position in FIG. 5. External reset is high so that SC1 is also closed at this time to provide VREFHI to the upper plates of the ADC capacitors. Once amplification is complete Store 1 goes low at control clock cycle 43 to open SS1 and at the same time the entire ADC capacitor array is connected to the amplifier output (SA0–SA7 swing to their right positions) to provide the amplified input signal voltage to the lower plates of the ADC. The capacitor array is thus charged to difference between VREFHI and the amplified input voltage level. At control clock cycle 4 External reset goes low to open SC1 so that the charge induced by the input voltage signal is trapped on the upper plates of the capacitors. Additionally, at control clock cycle 5 Store 2 goes high to reset the amplifier 16 and provide VREFHI to the lower plates of the ADC capacitors. Accordingly, the comparator input voltage level is equal to the sum of the amplified input voltage level and VREFHI and the ADC is ready to start a conventional charge-sharing successive approximation cycle.

In conventional systems, an amplifier for amplifying the input voltage and separate buffers for providing two reference voltages are provided. Thus, at this stage, the capacitors would be switched in turn between the two reference voltages (VREFHI and VREFLO in this case). However, as described above, in the present system SS2 is closed before the ADC cycle starts so that the amplifier 14 acts as a voltage follower, buffering VREFHI.

The use of the intermediate amplifier to fulfill these two requirements (signal amplification and VREFHI buffering) is important for two reasons. First, the need for a separate buffer is eliminated, with obvious savings in area and power consumption; it is estimated that the chip area saving is about 10%, while the power saving is nearly 20%. Secondly, since a common line supplies first the amplified input signal and then VREFHI to the ADC 16, the switches SA0–SA7 need only be two-way devices. In conventional ADCs, a capacity for switching between VREFHI, VREFLO, and the input signal voltage must be provided. This reduced switching requirement of the present system results in an area saving greater that of the eliminated reference buffer alone. Third, since the same amplifier is used to supply the input voltage and VREFH1 to the ADC, its offset is effectively eliminated.

The comparator used in the ADC is shown schematically in FIG. 7. The switch SC1 applies feedback around the first stage only, so there are no stability problems. Since most of the gain is in this stage, offset and flicker noise suppression is not degraded.

An initialization switch, SC2 controlled by an IntRst signal, is included to force the comparator to a condition close to its toggle point just before each decision in the ADC sequence. This speeds the decision, reducing the ADC cycle time and increasing throughput.

Each of the analog input channels 10 described above requires three fixed voltages (in addition to VDD and ground). These are referred to as VBIASO, VREFHI and VREFLO. VBIASO is used by a local bias generator in each channel to set voltages which control the current drawn by each operational amplifier, VREFHI acts as the internal voltage to which all signals are referenced, and VREFLO serves as the voltage defining the gain of the ADC (the gain is actually determined by the difference between VREFHI and VREFLO).

The bias and reference voltages are generated on the chip using band-gap reference circuits. There are major problems associated with generating and distributing the voltages to a large number of channels, each of which presents a significant load. However, on-chip generation does offer a number of advantages, some of which are important in achieving the very high level of analog integration on the system chip.

First, on chip references allow the freedom to choose both the value of the voltages and physical location of the generator. The voltages can thus be chosen for optimum performance of the main analog channels, and the distribution lengths can be minimized. It is also possible to choose the number of channels supplied by a single reference generator. The distribution of an external reference voltage would complicate the chip layout, which is critical for such a dense circuit, and compromise the separation of analog and digital sections as described below. The level of performance required of the analog circuitry also imposes constraints on the acceptable noise level and settling times for the reference voltages, and these can be met more readily using on-chip circuitry. Finally, of course, eliminating external references reduces overall system cost.

The analog circuitry on the system chip is divided into two separate halves, which have no direct communication, as described above. Thus, two separate bias and reference generators 22a and b are required, each supplying 32 channels. In practice, the cost of this is not large; much of the area in the reference sections is taken up by buffers needed to drive the loads presented by the large number of channels each supplies. If a single reference section were used, it would need to be almost as large as the two used in the MAD chip combined in order to drive the greater load.

The VBIASO generator is designed with a small positive temperature coefficient in order to increase the current drawn by the analog circuits as the chip temperature rises. This partially compensates the degradation in channel mobility with temperature, allowing lower power dissipation at room temperature while maintaining acceptable performance at elevated temperatures. The load seen by the VBIASO generator is very light, and a simple unbuffered generator circuit is adequate.

FIG. 8 is a schematic diagram of the reference voltage generation and distribution circuitry. The two reference voltages VREFHI and VREFLO are generated by conventional temperature compensated band gap reference voltage generators 80H and 80L. The generators 80 produce a voltage offset from a reference value indicated by VINIT. In each reference voltage section, a single VREFHI generator 80H is used, referenced to the external ground produces a voltage level of about 3 volts. The output from this voltage generator is sampled when it is valid by two buffers 82A and B, each supplying 16 channels. This keeps the settling time when all the channels sample or inject charge onto the VREFHI line simultaneously acceptable.

The gain of the ADCs is determined by the difference between VREFHI and VREFLO; to keep this as constant as possible, two VREFLO generators are used in each reference section, each referenced to one of the buffered VREFHI lines, to produce a voltage level of about 1.5 volts below VREFHI. The VREFLO signals are buffered and also delivered to 16 channels as shown.

Note that since the buffered VREFHI voltage is supplied to the VINIT input of the VREFLO voltage generator 80L, the offsets of the VREFHI voltage generator 80H and buffer do not effect the magnitude of the difference between VREFHI and VREFLO.

The 64 analog-to-digital converters used in the system chip are of the conventional charge-sharing, successive approximation type except in two main aspects. First, the switching array is simplified by the dual function amplifier/VREFH1 buffer as described above. Secondly, the novel physical capacitor structure is used in the capacitor array in order to minimize its area.

The invention has now been described with reference to a preferred embodiment. Modifications and substitutions will be apparent to a person of skill in the art. Accordingly, the invention is not intended to be limited except as provided by the appended claims.

What is claimed is:

1. A multichannel analog to digital convertor (ADC) formed on a single IC chip comprising:

a plurality of parallel ADC channels disposed on the single IC chip, each parallel channel including an analog signal path and capacitor array circuitry for converting an accepted analog signal of an unknown amplitude to a digital representation encoding a value of the amplitude of the accepted signal and each channel for accepting one analog input signal from a plurality of analog input signals at a selected time, each channel for concurrently converting each accepted analog input signal to a digital representation; and digital signal paths, separated from said analog signal paths and coupled to the capacitor array circuitry of each ADC channel, for transmitting digital control signals to the capacitor array circuitry.

2. A multichannel analog to digital convertor (ADC) formed on a single IC chip comprising:

a plurality of at least 10 parallel ADC channels disposed on the single IC chip, each parallel channel including an analog signal path and capacitor array circuitry for converting an accepted analog signal of an unknown amplitude to a digital representation encoding a value of the amplitude of the accepted signal and each channel for accepting one analog input signal from a plurality of analog input signals at a selected time, each channel for concurrently converting each accepted analog input signal to a digital representation; and digital signal paths, separated from said analog signal paths and coupled to the capacitor array circuitry of each ADC channel, for transmitting digital control signals to the capacitor array circuitry.

3. The ADC of claim 1 or 2 wherein the single IC chip includes an output port and further comprising:

digital means for transferring said converted digital representations to the output port.

4. The ADC of claims 1 or 2 wherein the circuitry for accepting an analog signal in each ADC channel further comprises:

an input amplifier having an input port; and an input switch for coupling said input port directly to an external source when the external source is providing an analog input charge signals and for coupling said input port to an input capacitor when the external source is providing an input analog voltage signal, where said input capacitor is previously charged to said input analog voltage.

5. The ADC of claims 1 or 2 wherein each ADC channel further comprises:

an input stage for accepting an analog input charge from an external source characterized by a large external capacitance and for generating an input voltage signal;

a second processing stage following said input stage; and an input switch for decoupling said large external capacitance prior to transferring said input voltage signal from said input stage to said second stage.

6. The ADC of claims 1 or 2 further including an on-chip bias voltage generation and distribution system comprising:

a first reference voltage generator, having an initial voltage input coupled to receive a fixed voltage and having an output port, for generating a first reference voltage differing from said fixed voltage by a first offset value;

a second reference voltage generator, having an initial voltage input coupled to the output port of said first reference voltage level generator to receive said first reference voltage and having an output port, for generating a second reference voltage differing from said first reference voltage by a second offset value so that the difference between said first and second reference voltages is not affected by errors generated by said first reference voltage generator.

7. The ADC of claim 3 wherein:

said digital means is a digital shift register including a plurality of stages for accepting said converted digital representations and subsequently shifting said accepted digital representations to the output port.

8. The multichannel analog to digital convertor (ADC) formed on a single IC chip comprising:

a plurality of ADC channels disposed on the single IC chip, each channel for accepting one analog input signal from a plurality of analog input signals and for concurrently converting each accepted analog input signal to a digital representation;

digital data transfer means for transferring said converted digital representations to the output port;

digital control means for generating digital control signals to control the operation of said channels and said digital transfer means;

digital signal transfer means for transferring digital control signals to said channels and said digital data transfer means where said digital data transfer means and said channels are disposed on separate isolated areas of the chip and said digital signal transfer means are isolated from said channels except at connection points of digital control signals required by a channel.

9. A multichannel analog to digital convertor (ADC) formed on a semiconductor integrated circuit comprising:

a plurality of parallel ADC channels, each channel including an input integrator stage, that accepts an analog input charge from an external source, for generating an input voltage signal indicating a magnitude of the analog input charge, a dual function amplifier stage, under control of a first digital signal, for amplifying the input voltage signal when the first digital signal is set and said amplifier stage is coupled to said integrator to generate an amplified input voltage signal and for providing a buffered first reference voltage when the first digital signal is reset and said amplifier stage is decoupled from said integrator, and a convertor stage, under control of a second digital signal, for storing said amplified input voltage state when said second digital signal is set and for utilizing said buffered first reference voltage to convert said stored amplified input voltage to a digital representation when said second digital signal is reset;

digital control means for setting and resetting said first and second digital signals, decoupling said amplifier stage from said integrator, and coupling said integrator to the external source during a first time period so that, during said first time period, said convertor stage utilizes said buffered reference voltage signal to convert a first amplified input voltage to a digital representation while said integrator stage generates a second input voltage signal and for coupling said amplifier to said integrator, decoupling said integrator from the external source, and controlling the states of said first and second digital signals during a second time period so that said amplifier stage amplifies said second input voltage signal and said convertor stage stores said amplified second input voltage signal during said second time period; and a digital shift register for accepting the digital representations of said first amplified input signal during said second time period from said plurality of ADC channels and for shifting said accepted digital representations to an ADC output port during a third time period when said second input voltage signal is being converted.

10. A multichannel analog to digital convertor (ADC) formed on a semiconductor integrated circuit comprising:

a plurality of parallel ADC channels, each channel including an input integrator stage, that accepts an analog input signal from an external source, for generating an input voltage signal indicating a magnitude of the analog input signal, a dual function intermediate amplifier stage, under control of a first digital signal, for amplifying the input voltage signal when the first digital signal is set and said intermediate amplifier stage is coupled to said input amplifier stage to generate an amplified input voltage signal and for providing a buffered first reference voltage when the first digital signal is reset and said intermediate amplifier stage is decoupled from said input amplifier, and a convertor stage, under control of a second digital signal, for storing said amplified input voltage state when said second digital signal is set and for utilizing said buffered first reference voltage to convert said stored amplified input voltage to a digital representation when said second digital signal is reset;

digital control means for setting and resetting said first and second digital signals, decoupling said intermediate amplifier stage from said input amplifier, and coupling said input amplifier to the external source during a first time period so that, during said first time period, said convertor stage utilizes said buffered reference voltage signal to convert a first amplified input voltage to a digital representation while said input amplifier stage generates a second input voltage signal and for coupling said intermediate amplifier to said integrator, decoupling said input amplifier from the external source, and controlling the states of said first and second digital signals during a second time period so that said intermediate amplifier stage amplifies said second input voltage signal and said convertor stage stores said amplified second input voltage signal during said second time period; and a digital shift register for accepting digital representations of said first amplified input signal during said second time period from said plurality of ADC channels and for shifting said accepted digital representations to an ADC output port during a third time period when said second input voltage signal is being converted.

11. The ADC of claim 10 wherein said input amplifier stage includes an input port and further comprises:
an input capacitor;
an input switch for coupling said input port directly to an external source when the external source is providing an analog input charge signal and to said input capacitor when the external source is providing an input analog voltage signal, where said input capacitor is subsequently charged to said input analog voltage.

12. A channel for converting a received analogue charge signal from an external source into a digital signal representing the magnitude of the received analogue charge signal, said channel comprising:
an integrator, having a first switch, an input that receives the analogue charge signal when coupled to the external source, and an output port for providing an analogue input voltage signal indicating the magnitude of the analogue charge signal to said input port when said first switch is open and for providing a first reference voltage when said first switch is closed;

an intermediate amplifier, including an input capacitor having a first plate coupled to the output port of said integrator by a second switch, a third switch, and an output port, for providing an amplified signal at the amplifier output port when said third switch is open and for providing said reference voltage when said third switch is closed;

a conversion stage coupled to the output port of said intermediate amplifier for storing the amplified signal provided by said amplifier and for utilizing the reference voltage provided by said intermediate amplifier to convert said stored amplified signal to a digital representation;

means for coupling said integrator to the source and opening said first switch during a first time interval to integrate a second analogue charge signal and generate a second analogue input voltage signal, for closing said third switch to provide said reference voltage, and for controlling said conversion stage to utilize said provided reference voltage to convert a first amplified signal to a digital representation during said first time interval;

means for decoupling said integrator from said source and closing said second switch during a second time interval to charge said input capacitor to said second analogue input voltage signal level;

means for closing said first switch to provide said reference voltage to the first plate of said input capacitor and opening said third switch to amplify said second input voltage signal to a second amplified signal during a third time interval, for controlling said conversion stage to store said second amplified signal during said third time interval, and for coupling said integrator to the source and opening said first switch so that a third analogue charge signal is integrated during said first time interval.

13. A multichannel ADC formed on a semiconductor integrated circuit comprising:
a plurality of parallel ADC channels each including an input stage for accepting a series of first, second and third analog input signals and generating associated first, second and third input voltage signals indicating magnitude of the analogue input signals and a convertor stage for converting said input voltage signals to a digital representation;

means for controlling said input stage to accept said third analog input signal and generating said third associated input voltage signal during a given time interval while said convertor stage is converting the second input voltage signal associated with said second analog input signal.

14. The ADC of claim 13 including an output port and further comprising:
digital transfer means for transferring a digital representation of a first analogue input signal to the output port during said given time interval.

* * * * *